United States Patent [19]
Kobayashi

[11] Patent Number: 6,014,400
[45] Date of Patent: Jan. 11, 2000

[54] SURFACE-EMITTING LASER AND A FABRICATION METHOD THEREOF

[75] Inventor: Yasuhiro Kobayashi, Osaka, Japan

[73] Assignee: Matsushita Electric Industrial Co., Ltd, Osaka, Japan

[21] Appl. No.: 08/921,566

[22] Filed: Sep. 2, 1997

[30] Foreign Application Priority Data

Sep. 2, 1996 [JP] Japan .................................. 8-231564

[51] Int. Cl.[7] ............................. H01S 3/08; H01S 3/085
[52] U.S. Cl. .............................. 372/96; 372/46; 372/44; 372/45
[58] Field of Search ............................. 372/96, 46, 45, 372/44

[56] References Cited

U.S. PATENT DOCUMENTS

| | | | |
|---|---|---|---|
| 5,493,577 | 2/1996 | Choquette et al. | 372/46 |
| 5,719,891 | 2/1998 | Jewell | 372/45 |
| 5,881,085 | 3/1999 | Jewell | 372/46 |

OTHER PUBLICATIONS

Hecht, J. Understanding Lasers. Second Edition. IEEE Press, pp. 134–135, 1994.

Hayashi, et al., "record low–threshold index–guided InGalAa/GaAlAs vertical–cavity surface–emitting laser with a native oxide confinement structure", Electronics Letters, vol. 31 No. 7, pp. 560–562,Mar. 30, 1995.

K.D. Choquette, et al., "Cavity characteristics of selectively oxidized vertical–cavity lasers", Appl. Phys. Lett. 66 (25) pp. 3413–3415, Jun. 19, 1995.

*Primary Examiner*—Rodney Bovernick
*Assistant Examiner*—Sung T. Kim
*Attorney, Agent, or Firm*—McDermott, Will & Emery

[57] ABSTRACT

In a surface-emitting laser comprising an active region which includes a light emitting layer and two mirrors which sandwich the active region, at least one of the two mirrors has a distributed Bragg reflector structure which comprises a plurality of first layers including aluminum and a plurality of second layers different from the first layers. At least one selected layer of the first layers has a selective oxide region including aluminum and a core semiconductor region surrounded by the selective oxide region.

15 Claims, 9 Drawing Sheets

Cl₂ RIE

Cl₂ RIE

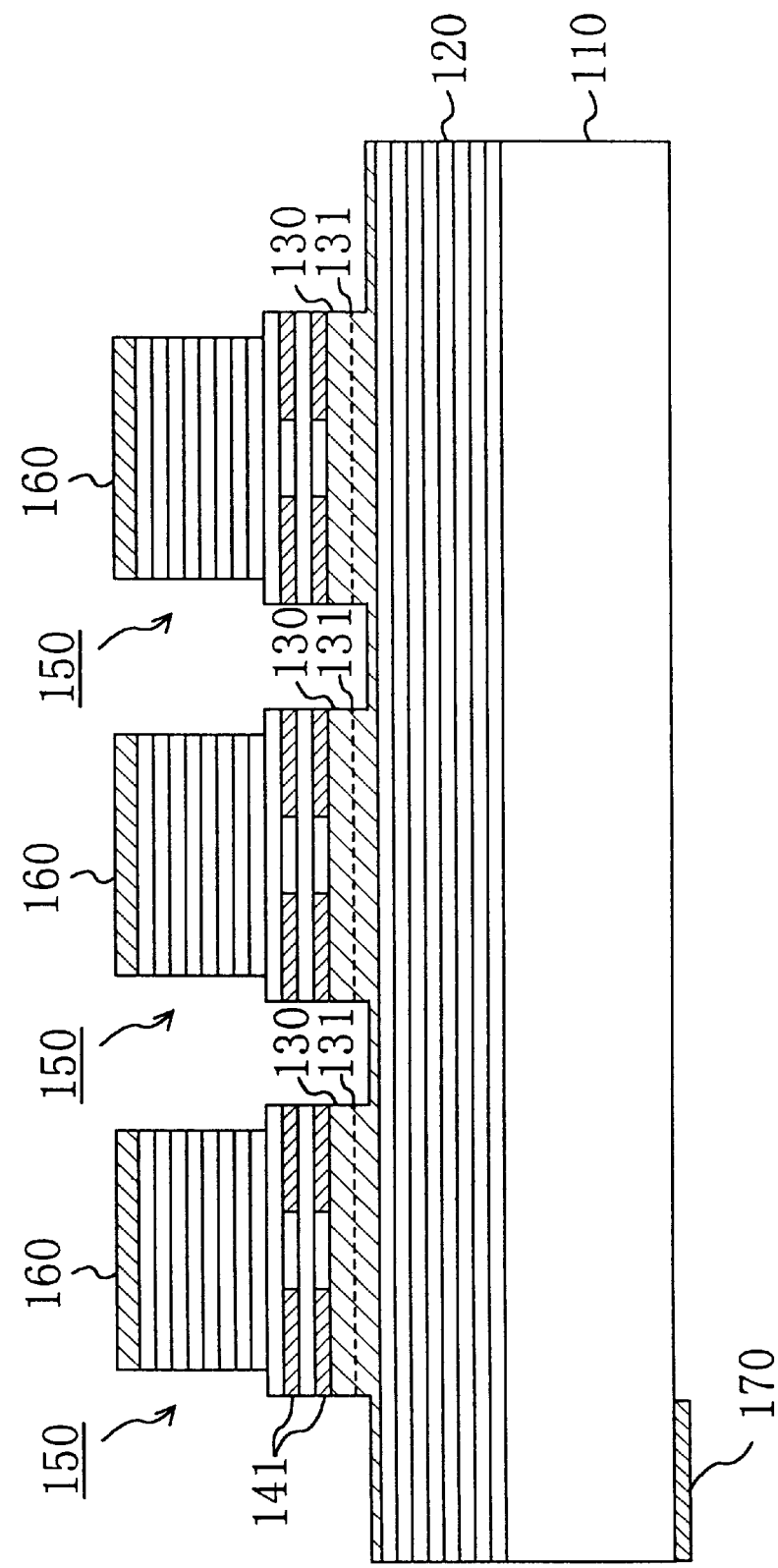

SURFACE-EMITTING LASER AND A FABRICATION METHOD THEREOF

BACKGROUND OF THE INVENTION

The present invention relates to a surface-emitting laser (SEL) and a fabrication method thereof, and specifically to a vertical-cavity surface-emitting laser (VCSEL) which is fabricated by using a selective oxidation process, and a fabrication method thereof.

According to a VCSEL, not only a light beam having a circular cross section can be obtained, but also a plurality of light emitting parts can be two-dimensionally integrated in high density on a single substrate. In addition, the VCSEL can be operated with low power consumption and fabricated at low cost. For such features, the VCSEL has been drawing attention as an optical source for optical communication and optical information processing in the next generation, and many investigations and development have been made for it so far.

Recently, researches have been actively conducted to improve VCSEL performance by selectively oxidizing semiconductor layers, such as AlGaAs layers, which included in a GaAs-based VCSEL mirror. One example of a VCSEL fabricated with this selective oxidation process is disclosed in Electronics Letters, 31 (1995). p. 560–562.

FIG. 9 is a schematic cross section showing the construction of the VCSEL disclosed in the above-mentioned literature. A VCSEL 900 shown in FIG. 9 comprises a vertical cavity which is disposed on an n-type GaAs substrate 910 and which includes n-DBR 920, InGaAs/GaAs strained quantum well 930, and p-DBR 940 which are stacked in this order on the substrate 910. Each of the p-type DBR and the n-type DBR has a multi-layer structure where GaAs layers 941 and AlAs/$Al_xO_y$ layers 942 are deposited alternately, and this multi-layer structure is etched in the form of a mesa down to the substrate 910. Each of the AlAs/$Al_xO_y$ layers 942 is composed of an AlAs region which is located in the mesa center, and an $Al_xO_y$ region which surrounds the AlAs region. The $Al_xO_y$ region is formed after the mesa etching process by oxidizing the AlAs layers in parts laterally from the mesa side wall. The entire mesa is protected by a polyimide 950. The output light 960 is outputted from the bottom surface of the substrate 910.

The following is a description of the operation of the VCSEL 900.

Since the $Al_xO_y$ regions (the shaded portions in FIG. 9) are insulators, a current flows through the narrow AlAs regions in the mesa center (white portions). As a result, electrical confinement effect is enhanced. In the AlAs/$Al_xO_y$ layers 942, the AlAs regions have different refractive index from the $Al_xO_y$ regions, so that an index guided waveguide structure is formed and lateral optical confinement is realized. Due to the electrical and optical confinement effect, a substantial decrease in the threshold current is expected.

On the mesa side wall, a thin damage layer is formed by mesa etching, which contains non-radiative recombination centers. For this reason, the current which flows in the vicinity of the mesa side wall becomes non-radiative current which does not contribute to light emission. Since this structure makes the current flows through the mesa center only, so as to make the non-radiative current nearly zero, a further decrease in the threshold current can be expected. The VCSEL 900 has realized the threshold current 70 $\mu$A which is the world-smallest value.

Another conventional example is disclosed in Applied Physics Letter, 66 (1995), p.3413–3415. FIG. 10 is a schematic cross section showing the construction of a VCSEL 1000 which is disclosed in the prior art document.

The VCSEL 1000 comprises an active layer 1020 and a p-DBR 1030 which are stacked in this order on an n-DBR 1010, and forms a mesa by etching down to the n-DBR 1010. A ring-shaped p-side electrode 1040 is formed on the p-DBR 1030. The p-DBR 1030 has a multi-layer structure which is composed of AlGaAs layers and GaAs layers deposited alternately. Only the AlGaAs layer which is lowermost in the multi-layer structure is composed of an $Al_{0.98}Ga_{0.02}As$ layer 1032 where Al mole fraction=0.98. The other layers are each composed of an AlGaAs layer and a GaAs layer where Al mole fraction=0.9. As a result, an $Al_{0.9}Ga_{0.1}As$/GaAs DBR 1033 functions as a top mirror.

In this prior art, only the $Al_{0.98}Ga_{0.02}As$ layer 1032 is selectively oxidized by using the oxidation rate difference between $Al_{0.98}Ga_{0.02}As$ and $Al_{0.9}Ga_{0.1}As$ (about 15:1), so as to form the $Al_xO_y$ region 1031.

The VCSEL 1000 operates in the same manner as the VCSEL 900 shown in FIG. 9, and offers a lower threshold current.

According to the above-mentioned first prior art, the obtained optical output has only several $\mu$W order. The second prior art employs a hybrid mirror structure which uses two types of AlGaAs layers having different Al mole fractions from each other in order to oxidize only one layer. To be more specific, an AlGaAs layer (having a larger Al mole fraction) which is susceptible to oxidation is used as a layer to be selectively oxidized whereas the other AlGaAs layers which are not oxidized have a smaller Al mole fraction. According to this construction, it is necessary to use AlGaAs layers (having a smaller Al mole fraction) whose refractive index is closer to that of the GaAs layers than that of AlGaAs layers having a large Al mole fraction for the most part of the mirror. In order to obtain a sufficient reflectivity when the refractive index difference between the GaAs layers and AlGaAs layers which compose a mirror is small, a mirror must include more layers than in the case where AlGaAs layers with a large Al mole fraction are used. This not only raises the manufacturing cost but also increases the mirror resistance.

SUMMARY OF THE INVENTION

The object of the present invention is to provide a SEL which can operate with low threshold current by using a low-resistance mirror and achieve a high optical output, and also to provide the fabrication method of the SEL.

According to the present invention, a surface-emitting laser is provided that comprises an active region which includes a light emitting layer and two mirrors which sandwich the active region, wherein at least one of the two mirrors has a distributed Bragg reflector structure which has a plurality of first layers including aluminum and a plurality of second layers different from the first layers; and at least one selected layer of the plurality of first layers has a selective oxide region including aluminum and a core semiconductor region surrounded by the selective oxide region.

According to another aspect of the present invention, a surface-emitting laser is provided that comprises an active region which includes a light emitting layer and two mirrors which sandwich the active region, wherein at least one of the two mirrors has a distributed Bragg reflector structure which has a plurality of first layers including aluminum and a plurality of second layers different from the first layers; and at least one selected layer of the plurality of first layers has a surface passivation region and a core semiconductor region surrounded by the surface passivation region.

According to another aspect of the present invention, a surface-emitting laser array is provided that comprises a plurality of vertical cavities arranged on a single substrate, and that further comprises a single bottom mirror which is shared by the plurality of vertical cavities, a plurality of top mirrors associated with a respective one of the plurality of vertical cavities, and a plurality of active regions disposed between the plurality of top mirrors and the bottom mirror, wherein at least one of the bottom mirror and the plurality of top mirrors has a distributed Bragg reflector structure which has a plurality of first layers including aluminum and a plurality of second layers different from the first layers; and at least one selected layer of the plurality of first layers has a selective oxide region including aluminum and a core semiconductor region surrounded by the selective oxide region.

According to another aspect of the present invention, a fabrication method of a surface-emitting laser is provided that has an active region which includes a light emitting layer and two mirrors which sandwich the active region, and which comprises the steps of: forming a multi-layered film comprising a plurality of first layers including aluminum and a plurality of second layers different from the plurality of first layers; etching the multi-layered film in parts by a first mesa etching, so as to form a top mesa section from the multi-layered film and expose a side wall of the top mesa section; covering the side wall of the top mesa section with a protective film: etching the multi-layered film further deeper by a second mesa etching, so as to form a bottom mesa section and expose a side wall of the bottom mesa section; and selectively oxidizing the plurality of first layers included in the bottom mesa section, from the side wall of the bottom mesa section.

BRIEF DESCRIPTION OF THE DRAWINGS

FIG. 12 is a schematic cross section of a VCSEL array in accordance with the fifth embodiment of the present invention.

PREFERRED EMBODIMENT OF THE INVENTION

The embodiments of the present invention will be described with reference to the attached drawings.

(Embodiment 1)

Figure 1:
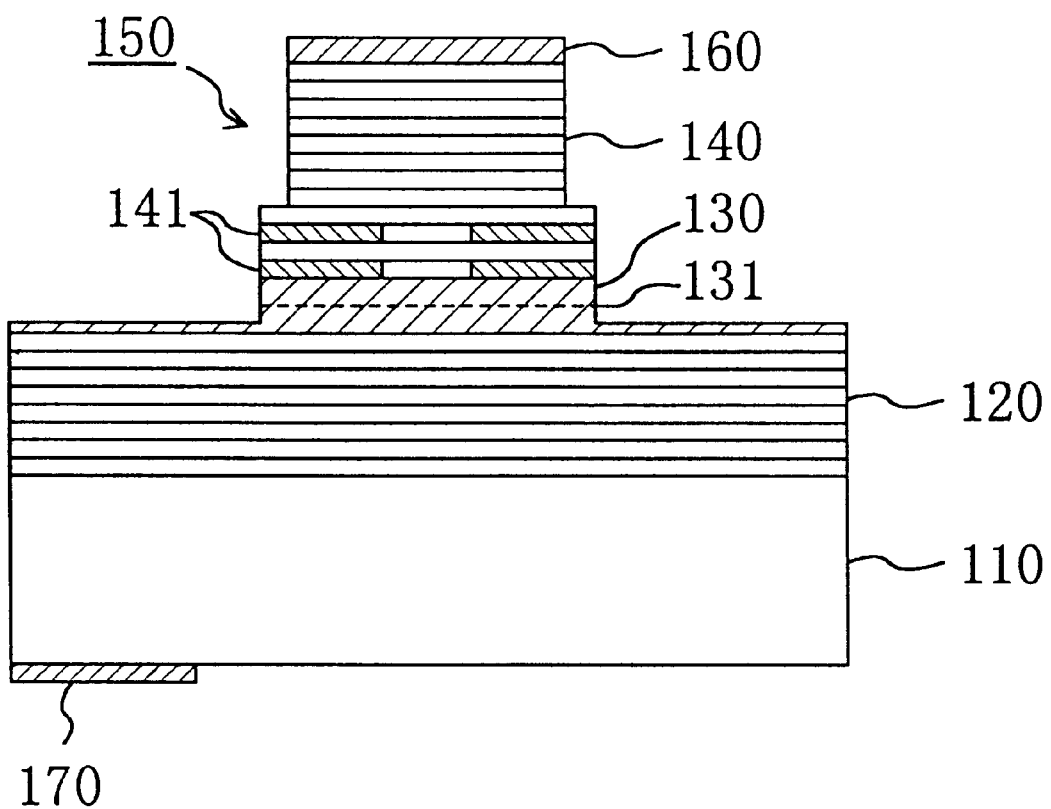
FIG. 1 is a schematic cross section showing a VCSEL in accordance with the first embodiment of the present invention.

FIG. 1 is a schematic cross section illustrating a VCSEL in accordance with the first embodiment of the present invention. In FIG. 1 the VCSEL 100 is formed on a p-type GaAs substrate 110. The VCSEL 100 has a multilayer structure for laser oscillation including a p-type bottom mirror 120, an active region 130, and an n-type top mirror 140. The bottom mirror 120 is formed on the substrate 110, and the active region 130 is disposed between the bottom mirror 120 and the top mirror 140. The above-mentioned multilayer structure will be detailed as follows.

The bottom mirror 120 is composed of 24.5 pairs of p-type AlAs layers (corresponding to first layers) and p-type GaAs layers (corresponding to second layers) which are stacked with p-type intermediate layers therebetween, and functions as a distributed Bragg reflector (DBR) for the bottom side. In the same manner, the top mirror 140 is composed of 24.5 pairs of n-type AlAs layers (corresponding to the first layers) and n-type GaAs layers (corresponding to the second layers) which are stacked with n-type intermediate layers therebetween, and functions as a distributed Bragg reflector for the top side.

The active region 130 comprises an active layer (light emitting layer) 131 which has a strained quantum well including an $In_{0.2}Ga_{0.8}As$ layer functioning as a well layer and a GaAs layer functioning as a barrier layer, and $Al_{0.5}Ga_{0.5}As$ cladding layers which sandwich the active layer 131. The active region 130 is designed to lase light having a wavelength of about 0.98 $\mu$m.

The VCSEL 100 has a mesa 150. The mesa 150 includes two-step mesa sections: the bottom mesa section has a larger outer diameter than the top mesa section. To be more specific, the top mesa section has an outer diameter of about 10 $\mu$m, and the bottom mesa section about 11 $\mu$m. The mesa 150 having this two-step structure is formed by a two-step mesa etching process as will be described below. The top mesa section includes most of the top mirror 140 whereas the bottom mesa section includes part (bottom) of the top mirror 140, a top cladding layer, the active layer 131, and part of a bottom cladding layer. The second mesa etching is stopped before the top surface of the bottom mirror 120 is entirely exposed, so that the top surface of the bottom mirror 120 is covered with the bottom cladding layer as shown in FIG. 1.

The peripheral edge of the p-type AlAs layers included in the top mesa section has not been oxidized, but the peripheral edge of the p-type AlAs layers included in the bottom mesa section has been selectively oxidized. As a result, each p-type AlAs layer included in the bottom mesa section is divided into a selective oxide region 141 and a core semiconductor region which is surrounded by the selective oxide region 141. The selective oxide region 141 functions as a current aperture. The drive current for laser oscillation, which is confined by the insulating selective oxide region 141, flows vertically through the core semiconductor regions. The size (diameter) of the core semiconductor regions reduces as oxidation proceeds laterally. This point will be detailed below.

According to the present embodiment, the etching for forming the mesa 150 is stopped at the point where the bottom cladding layer which is disposed between the active layer 131 and the bottom mirror 120 is etched in parts. As a result, the top cladding layer and the active layer 131 are included in the bottom mesa section, but the bottom mirror 120 is not subjected to the mesa etching, and accordingly, is not formed into a mesa. Therefore. the AlAs layers in the bottom mirror 120 are not subjected to oxidation in the selective oxidation process, and the selective oxide regions 141 for electrical and optical confinement are formed only above the active layer 131.

The VCSEL 100 further comprises an n-side electrode 160 which is formed on the top surface of the top mirror 140 and a p-side electrode 170 which is formed on the back surface of the p-type substrate 110. These electrodes 160 and 170 supply the active region 130 with current. The laser light which is generated in the vertical cavity is outputted from the bottom surface of the substrate 110.

Then, the fabrication process sequence of the VCSEL 100 will be described with reference to FIGS. 2A–2D. In FIGS. 2A–2D the same components as those shown in FIG. 1 are assigned the same reference numbers and their description is not repeated.

Figure 2A:
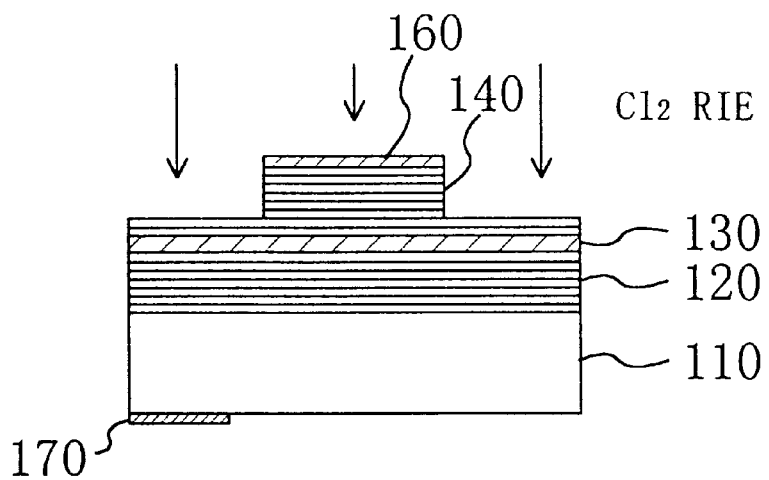
FIGS. 2A–2D are cross sections illustrating the fabrication process sequence of the VCSEL shown in FIG. 1.

As shown in FIG. 2A a plurality of semiconductor layers for forming the bottom mirror 120, the active region 130, and the top mirror 140 are epitaxially grown on the semiconductor substrate 110 by an MBE process (molecular beam epitaxy process) or an MOCVD process (metalorganic vapor-phase epitaxy process). The n-side electrode 160 and the p-side electrode 170 are formed on the VCSEL wafer thus obtained. The n-side electrode 160 is patterned by using a photo mask which defines the position and shape of the top mesa section. The n-side electrode 160 is made of, for example, Au/AuGe/Ni (having thickness of 100 nm, 150 nm, and 5 nm, respectively). The p-side electrode 170 is made of, for example, Cr/Au (having thickness of 50 nm and 150 nm, respectively).

Then, the first mesa etching is conducted by using a $Cl_2$-based RIE method under the conditions of $Cl_2$:Ar:$CF_4$= 1:10:3, power:500 W, and etching time:50 minutes.

The n-side electrode 160 functions as a mask for this mesa etching. The etching is so controlled as to stop at the middle level of the top mirror 140 as shown In FIG. 2A. Consequently, the first mesa etching makes the two n-type AlAs layers of the top mirror 140 which are nearest to the active layer 131 remain unetched.

Figure 2B:
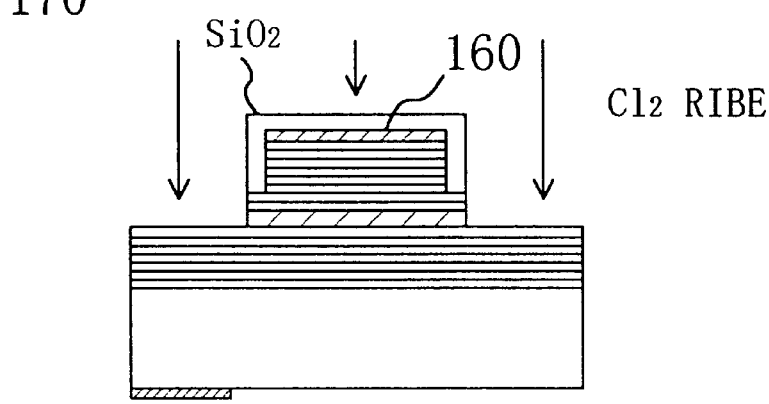

Then, the top surface and side wall of the top mesa section which has been formed by the first mesa etching are covered with an $SiO_2$ protective film as shown in FIG. 2B. The $SiO_2$ protective film is obtained by covering the entire surface of the substrate with a 500 nm-thick $SiO_2$ film which has been deposited by using a plasma CVD process or the like, and selectively etching parts of the $SiO_2$ film which are in contact with the bottom cladding layer. Such selective etching requires a photo mask for defining the position and shape of the $SiO_2$ protective film. The photo mask has a different pattern size from the photo mask which is used for the patterning of the n-side electrode 160. When the $SiO_2$ protective film is deposited by a physical evaporation process such as a spattering process, the top mesa section must have a tapered portion in such a manner as to incline the side wall of the top mesa section. The $SiO_2$ protective film can be replaced by a SiN protective film.

Then, the second mesa etching is conducted by $Cl_2$-based RIBE method under the conditions of $Cl_2$:$H_2$=1:1, power:200 W, accelerating voltage:500 volt, and etching time:50 minutes. The $SiO_2$ protective film functions as a mask for the second mesa etching. This etching is so controlled as to proceed as deep as right under the active region 130.

Figure 2C:
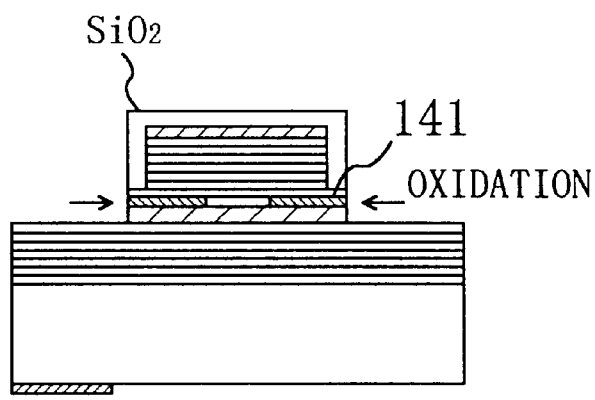

As shown in FIG. 2C an oxidizing species is laterally diffused from the side wall of the bottom mesa section which are exposed by the second mesa etching to the inside of the bottom mesa section. Thus, the peripheral edge of the AlAs layers which are included in the bottom mesa section is selectively oxidized so as to form selective oxide regions 141. Since an oxidizing species cannot diffuse into the $SiO_2$ protective film quickly, the top mesa section whose side surfaces are covered with the $SiO_2$ protective film is free from oxidation. Thus, the $SiO_2$ protective film functions as an anti-oxidation film or an oxidation mask.

Figure 2D:
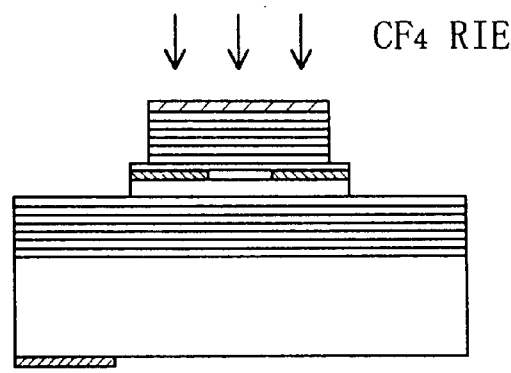

Finally, as shown in FIG. 2D the $SiO_2$ protective film is removed by a $CH_4$-based RIE method, thereby forming the structure shown in FIG. 1.

As mentioned before, the $SiO_2$ protective film shown in FIG. 2C functions to prevent the AlAs layers included in the top mesa section from being selectively oxidized in the selective oxidation process. When the $SiO_2$ protective film is thick enough, it functions as a powerful anti-oxidation film so that no selective oxide region is formed in the top mesa section. On the other hand, when the $SiO_2$ protective film is sufficiently thin, there is a possibility that a small selective oxide region is formed in the top mesa section. However, as long as the small selective oxide region does not affect the resultant electrical confinement seriously, an increase in the mirror resistance is substantially reduced. Consequently, even if the $SiO_2$ protective film fails to perfectly prevent the selective oxidation of the top mesa section, the optical output can be improved to some extent. The preferable thickness of the $SiO_2$ protective film is in a range of about 300 nm to 500 nm in the present embodiment.

Figure 3:
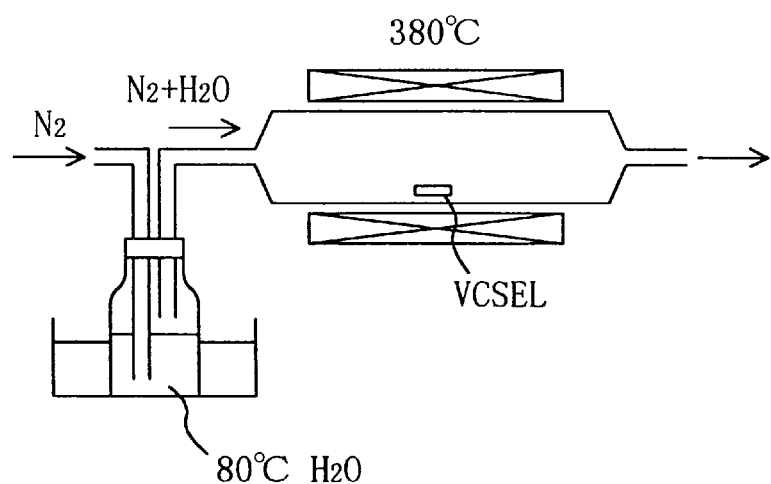
FIG. 3 is a schematic cross section showing the apparatus used for oxidizing the VCSEL.

FIG. 3 illustrates a schematic construction of an oxidation apparatus used for the above mentioned selective oxidation. As shown in FIG. 3 $N_2$ is bubbled with $H_2O$ whose temperature is about 80° C., so as to introduce $H_2O$-contained $N_2$ to a furnace which is heated at about 380° C. Instead of $N_2$, inert gas such as Ar may be used. A VCSEL is put in the furnace and the surface of the VCSEL is oxidized in parts. The size of the selective oxide region (the lateral size measured from the surface of a mesa side wall towards the mesa center) is adjusted by controlling the oxidation time.

Figure 4:
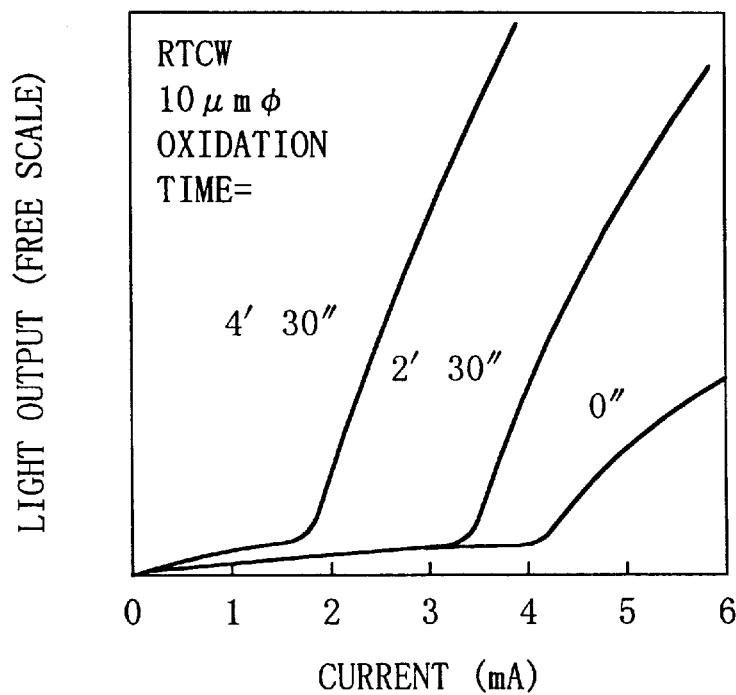
FIG. 4 is a graph showing the relationship between the oxidation time and the optical output-current characteristics of the VCSEL shown in FIG. 1.

FIG. 4 is a graph showing the relationship between the oxidation time and the optical output-electrical characteristics of a VCSEL. The mesa used for the measurement Is cylindrical and has a diameter of 10 $\mu$m. The curves in FIG. 4 represent the property when the oxidation time is 0" (no oxidation), 2'30", and 4'30", respectively. When the oxidation time is 0", 2'30, or 4'30", the threshold current is about 4 mA, about 3.2 mA, or about 1.7 mA, respectively. As apparent from the graph in FIG. 4, the threshold current decreases as the oxidation time increases. This is because as the oxidation time increases, the selective oxide region grows laterally, which strengthen the degree of the electrical confinement. When the oxidation time is 4 minutes and 30 seconds (4'30"), a selective oxide region having a lateral size (width) of about 1–2 $\mu$m is formed, whereas the diameter of the core semiconductor region decreases from about 11 $\mu$m to about 7–9 $\mu$m. Thus, the presence of the selective oxide region 141 in the vicinity of the mesa side wall realizes the electrical and optical confinement and decreases non-radiative current, thereby reducing the threshold current. In the present embodiment only two AlAs layers of the top mirror are oxidized, so that the mirror resistance hardly increases. As a result, little problem is caused by the heat evolvement during the operation of a device, and as seen in FIG. 4 the maximum optical output is never restricted by the heat evolvement.

On the other hand, when the oxidation time is 2 minutes and 30 seconds (2'30"), almost no selective oxide region is formed. The lateral size of this selective oxide region is estimated to be 0.1 μm or below, so that the electrical and optical confinement due to the presence of the selective oxide region can be hardly expected. Nevertheless, the threshold current sufficiently decreases. The reason for this is considered that the damage layer formed on the mesa surface layer is passivated in the selective oxidation process, and has reduced the non-radiative current.

Thus, in the VCSEL 100 in accordance with the present embodiment the laser mesa 150 is formed by a two-step etching. The AlAs layers of the top mirror 140 included in the bottom mesa section are selectively oxidized by covering the top mesa section with the $SiO_2$ protective film, so as to form two-layered selective oxide region 141. As a result, the use of the selective oxidation process does not lead to an increase in the resistance of the top mirror 140, so that the threshold current can be reduced.

From the viewpoint of maintaining the mirror resistance low, the selective oxide region 141 most preferably consists of a single layer. The lateral electrical confinement can bring about sufficient effect even when the selective oxide region 141 consists of a single-layer. However, from the viewpoint of enhancing the lateral optical confinement, it is preferable that as many layers of the selective oxide region 141 as possible are disposed within the range of light extending vertically from the active layer 131. By taking these conditions into consideration, the selective oxide region 141 preferably consists of one to five layers and most preferably one to three layers.

Besides the embodiment shown in FIG. 1, it is possible to employ another embodiment in which the outermost layer of the side wall of the mesa 150 (for example, 0.1 μm or less deep from the surface) is exclusively oxidized, so that the selective oxide region does not substantially contribute to the lateral electrical confinement. This is because, as mentioned before, the damage layer formed on the side wall surface of the mesa 150 can be passivated (the formation of a passivation region) only by exposing the mesa surface in an oxidizing ambient. Consequently, the non-radiative current resulting from the presence of the non-radiative recombination centers is reduced, and accordingly, the threshold current can be reduced without increasing the mirror resistance at all.

(Embodiment 2)

Figure 5:
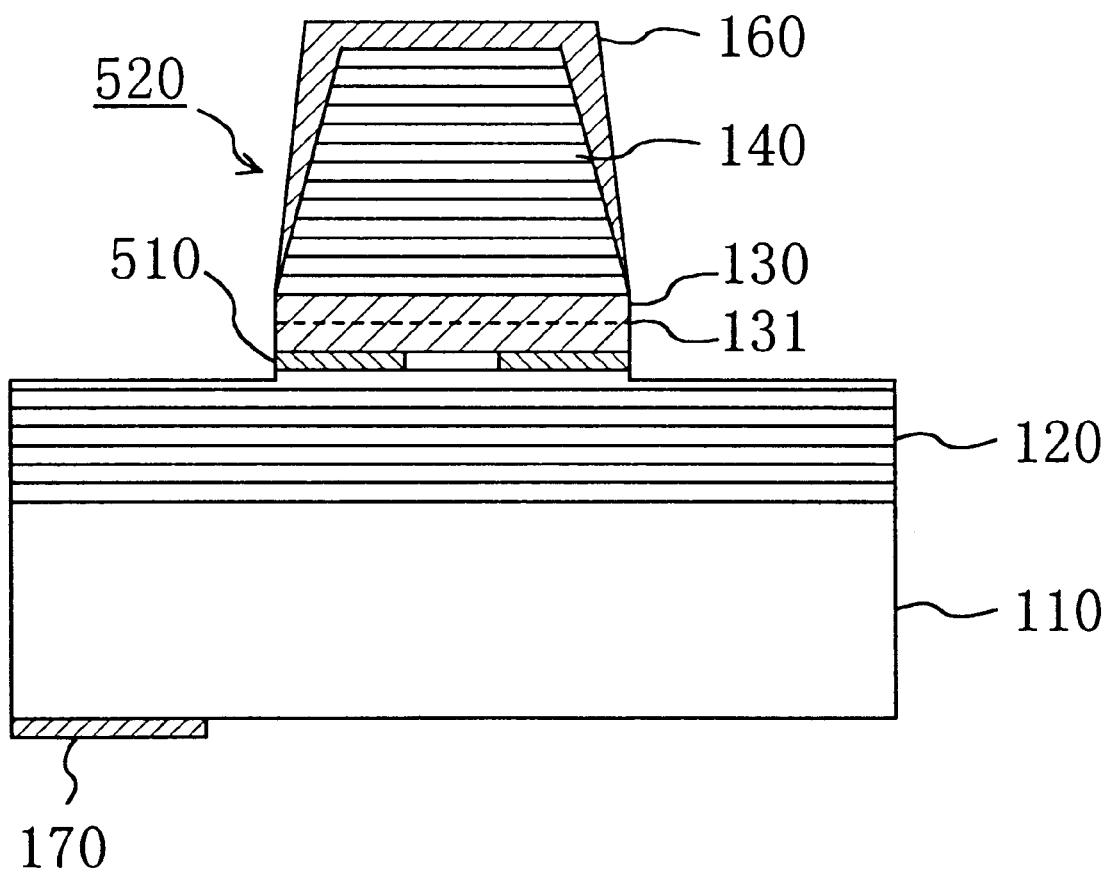
FIG. 5 is a schematic cross section showing a VCSEL in accordance with the second embodiment of the present invention.

FIG. 5 is a schematic cross section illustrating a VCSEL 500 in accordance with the second embodiment of the present invention. In FIG. 5 the same components as those of the VCSEL 100 in accordance with the first embodiment are assigned the same reference numbers and their description is not repeated.

The top portion of the laser mesa 520 (from the summit of the top mirror 140 down to the inside of the active region 130) is tapered. An n-side electrode 160 is formed in such a manner as to cover the top surface of the tapered portion and the inclined side surface. The laser mesa 520 is formed by etching as deep as only a pair in the bottom mirror 120 is etched. A selective oxide region 510 which consists of a single layer extends laterally from a portion of the side wall of the mesa 520 which is not covered with the n-side electrode 160 towards the inside of the mesa.

Figure 6A:
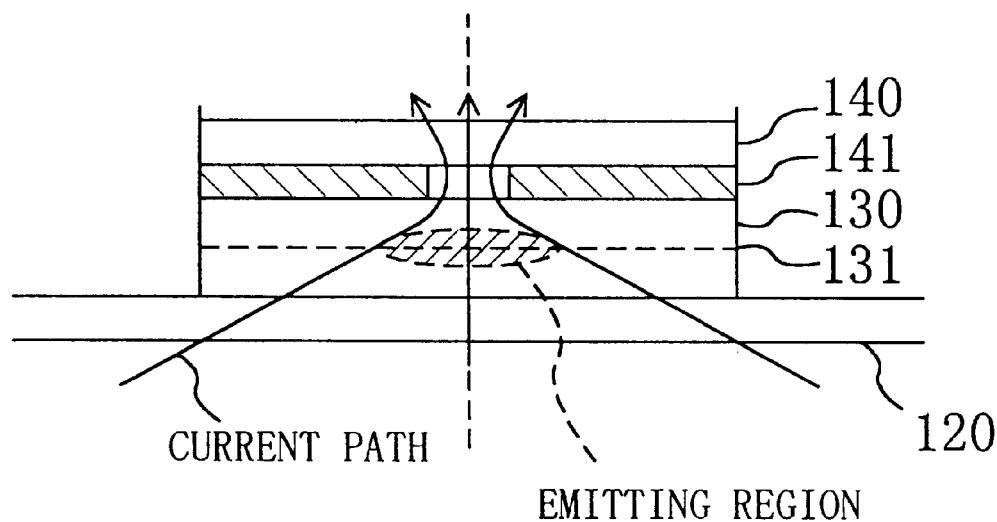
FIG. 6A is a schematic cross section showing the electrical confinement and light emitting region in the VCSEL shown in FIG. 1.

In the present embodiment, as shown in FIG. 5, only the uppermost AlAs layer of the p-type bottom mirror 120 is oxidized so as to realize lateral electrical confinement. On the other hand, in the first embodiment, as shown in FIG. 1 the AlAs layers of the n-type top mirror are oxidized so as to conduct electrical confinement. The difference in the VCSEL property resulting from the difference in the electrical confinement will be described with reference to FIGS. 6A and 6B. FIG. 6A is a schematic cross section when electric confinement is conducted on the side of the n-type mirror, which corresponds to the first embodiment. As shown in FIG. 6A there is a certain distance (half as thick as the active region 130) between the selective oxide region 141 for electrical confinement and the active layer 131 which is a light emitting layer, so that the current path somewhat spreads out between them. Consequently, the actual light emitting region becomes larger than the confined region in the selective oxide region 141. Such an expansion of the light emitting region also occurs when electrical confinement is conducted on the side of the p-type mirror shown in FIG. 6B (the present embodiment) from the same principle.

Figure 6B:
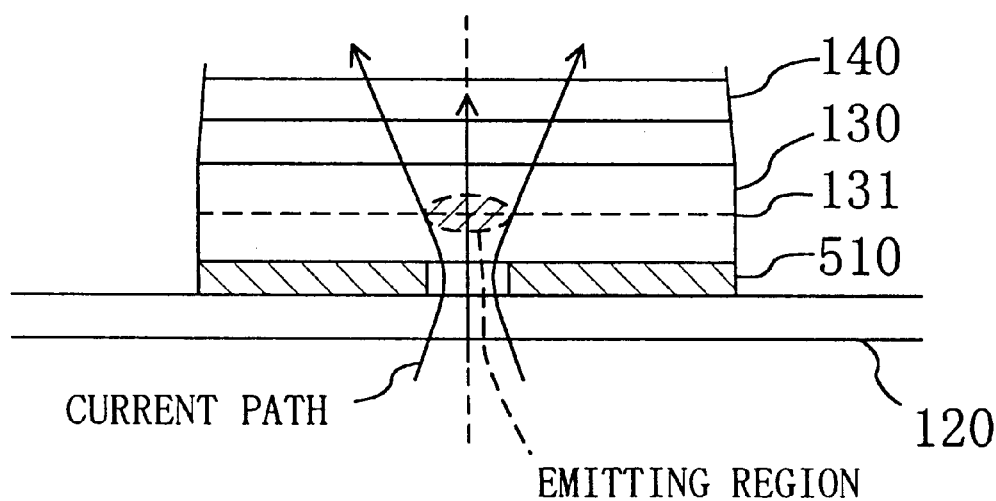
FIG. 6B is a schematic cross section showing the electrical confinement and light emitting region in the VCSEL shown in FIG. 5.

However, the degree of expansion of the light emitting region differs depending on whether the active region 130 in which the current path spreads is an n-type or a p-type. To be more specific, because the p-type region, which is dominated by the current resulting from holes having a small mobility, has a smaller current spreading, as shown in FIGS. 6A and 6B the light emitting region in the present embodiment becomes smaller than in the first embodiment. Thus, the VCSEL 500 in accordance with the present embodiment can bring about a more advantageous effect of electrical and optical confinement and less threshold current than the VCSEL 100 in accordance with the first embodiment.

The fabrication process sequence of the VCSEL 500 will be described with reference to FIGS. 7A–7D. In FIGS. 7A–7D the same components as those shown in FIG. 5 are assigned the same reference numbers and their description is not repeated.

Figure 7A:
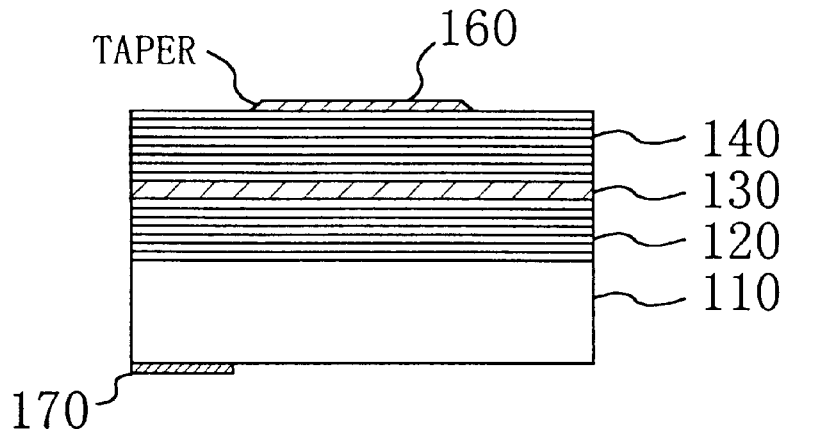
FIGS. 7A–7D are schematic cross sections illustrating the fabrication process sequence of the VCSEL shown in FIG. 5.

As shown in FIG. 7A a plurality of semiconductor layers for forming the bottom mirror 120, the active region 130, and the top mirror 140 are epitaxially grown on the semiconductor substrate 110 by the MBE process or the MOCVD process. Then a bottom layer portion of the n-side electrode 160 and the p-side electrode 170 are formed on the VCSEL wafer thus obtained. The bottom layer portion of the n-side electrode 160 is patterned so as to define the position and shape of the top mesa section. The bottom layer portion of the n-side electrode 160 is so formed that the electrode edges are tapered by using a lift-off method or the like. The bottom layer portion of the n-side electrode 160 is made of, for example, Au/AuGe/Ni (having thickness of 100 nm, 150 nm, and 5 nm, respectively). The p-side electrode 170 is made of, for example, Cr/Au (having thickness of 50 nm and 150 nm, respectively).

Figure 7B:
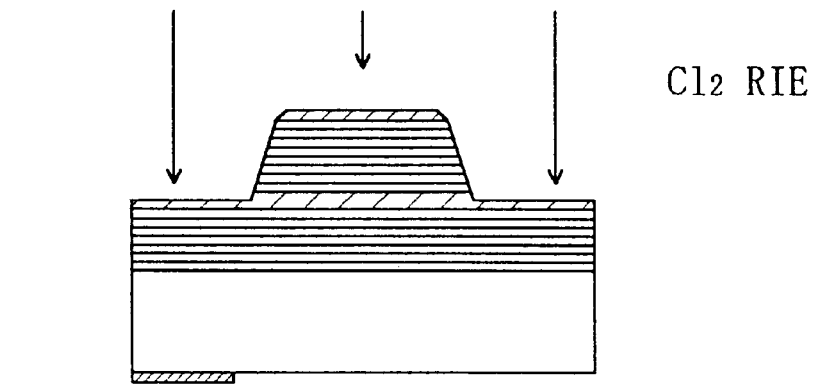

As shown In FIG. 7B the first mesa etching is conducted by using $Cl_2$-based RIE method. The bottom layer portion of the n-side electrode 160 functions as a mask for this etching. In the present embodiment the etching passes the bottom end of the top mirror 140 and reaches inside the active layer region 130.

Figure 7C:
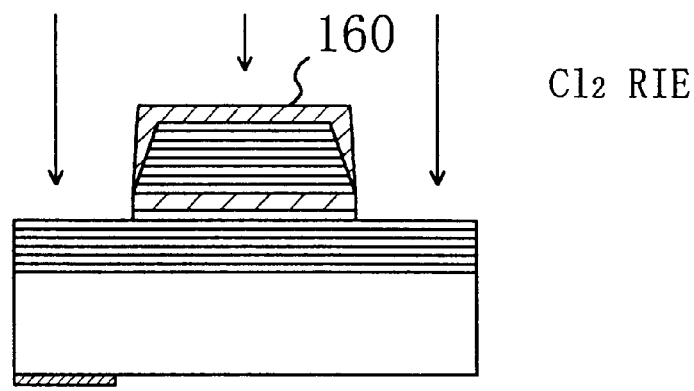

Then, as shown in FIG. 7C after a top layer (an additional layer) portion of the n-side electrode 160 is formed on the bottom layer portion of the n-side electrode 160 in such a manner as to cover the side wall of the top mesa section, the second mesa etching is conducted by using the $Cl_2$-based RIE method. The top layer portion of the n-side electrode 160 is made of, for example, Ni having a thickness of 400 nm. The top layer portion of the n-side electrode 160 functions as a mask for the second etching. This etching is so controlled as to etch the AlAs layer which is nearest to the top surface of the bottom mirror 120.

Figure 7D:
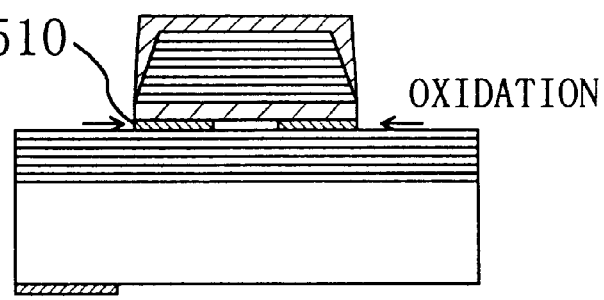

Finally, as shown in FIG. 7D only the uppermost AlAs layer of the bottom mirror 120 is oxidized from the exposed surface of the mesa side wall, thereby forming the selective oxide region 510.

The oxidation method used in the present embodiment will be described as follows.

The oxidation is performed by boiling the VCSEL 500 in $H_2O_2$. This method can facilitate selective oxidation, without using a large apparatus as shown in FIG. 3 which is used in the process of fabricating the VCSEL 100 in accordance with the first embodiment.

Furthermore, in the fabrication process sequence of the VCSEL 500 in accordance with the present embodiment, the bottom layer portion of the n-side electrode 160 is used as the etching mask for the top mesa section (refer to FIG. 7A). Since the bottom layer portion of the n-side electrode 160 has tapered edges, the mask edges are gradually etched and retreat laterally. In other words, the size of the etching mask (bottom layer portion of the n-side electrode 160) reduces laterally while the mesa etching proceeds. As a result, as shown in FIG. 7B the side wall of the top mesa section becomes tapered to be inclined. The taper angle can be about 80°. A photo mask is needed to pattern the top layer portion of the n-side electrode 160 in such a manner as to cover only the top and side surfaces of the top mesa section. Since the photo mask used for the formation of the bottom layer portion of the n-side electrode 160 can be used as this photo mask, no additional photo mask is needed.

As described hereinbefore, in the VCSEL 500 in accordance with the present embodiment selective oxidation is applied to the p-type bottom mirror 120, and electrical confinement is conduced inside the p-type bottom mirror 120. Consequently, stronger electrical and optical confinement and less threshold current can be realized than in the case where the selective oxidation is applied to the n-type top mirror 140.

In addition, since the top mesa section is etched so as to have a tapered portion, the number of the photo masks can be smaller by one than in the first embodiment. As a result, a VCSEL can be fabricated with lower cost.

Furthermore, the selective oxidation by boiling a VCSEL in $H_2O_2$ simplifies the process of fabricating a VCSEL having a selective oxide region.

(Embodiment 3)

Figure 8:
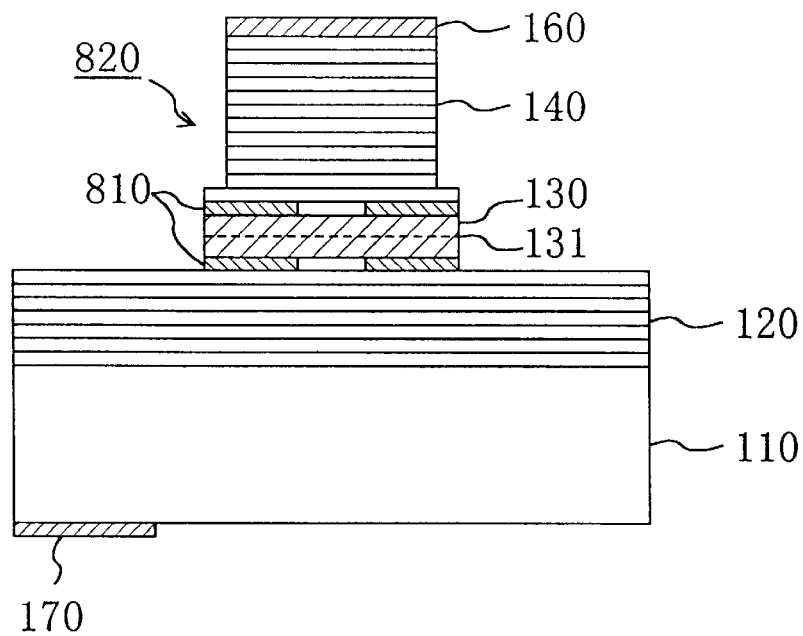
FIG. 8 is a schematic cross section illustrating a VCSEL in accordance with the third embodiment of the present invention.
Figure 9:
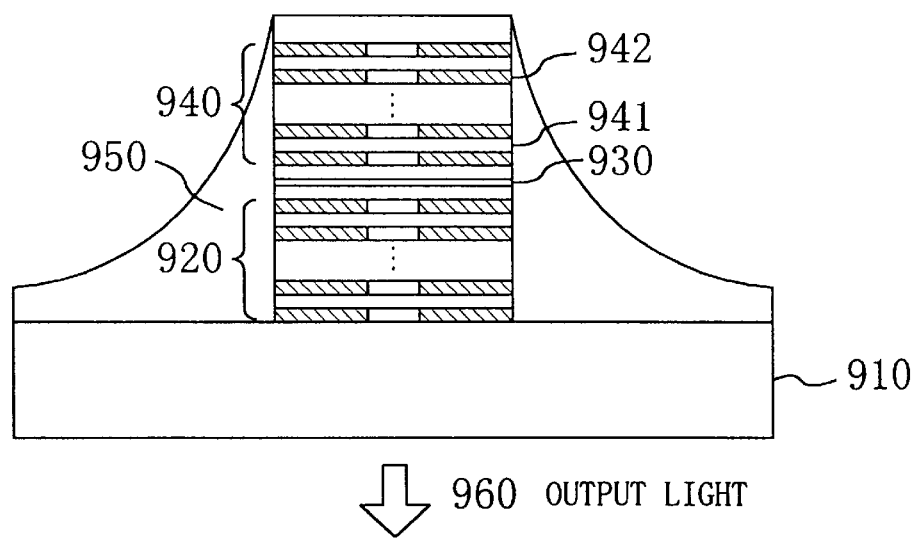
FIG. 9 is a schematic cross section illustrating a VCSEL disclosed in the first prior art document.
Figure 10:
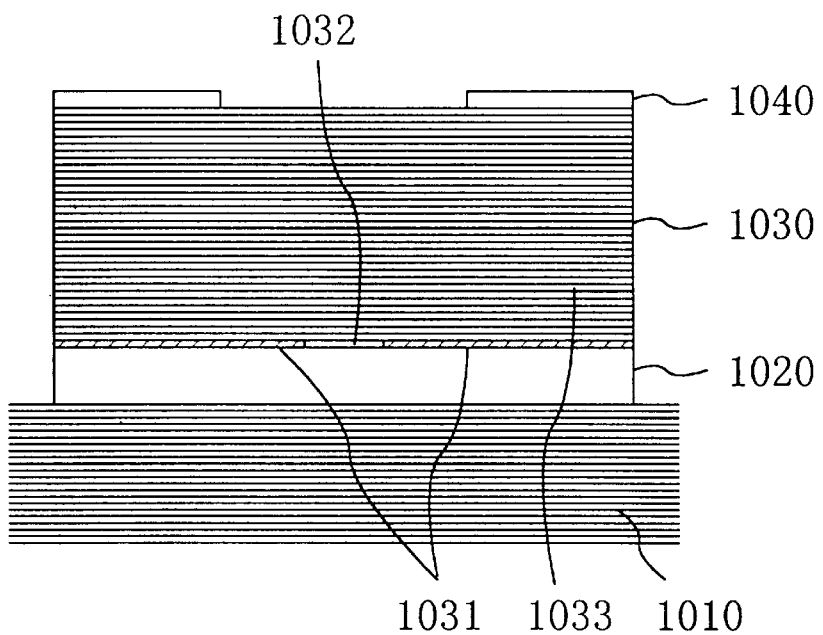
FIG. 10 is a schematic cross section illustrating a VCSEL disclosed in the second prior art document.

FIG. 8 is a schematic cross section illustrating a VCSEL 800 in accordance with the third embodiment of the present invention. The same components as those of the VCSEL 100 in accordance with the first embodiment are assigned the same reference numbers and their description is not repeated.

The laser mesa 820 comprises a top mesa section having a diameter of about 10 $\mu$m and a bottom mesa section having a diameter of about 11 $\mu$m. The top mesa section is formed by the first mesa etching for etching as deep as only the lowermost pair in the top mirror 140 is left unetched. The bottom mesa section is formed by the second mesa etching for etching only a pair in the bottom mirror 120.

The bottom mesa section of the laser mesa 820 has a diameter larger than the top mesa section by 1 $\mu$m. The two AlAs layers included in the bottom mesa section are oxidized in parts from a mesa side wall towards the mesa center, so as to form the selective oxide region 810 which consists of two layers.

In the present embodiment, as shown in FIG. 8 AlAs layers of both the n-type top mirror 140 and the p-type bottom mirror 120 are selectively oxidized. As a result, electrical confinement is conducted above and below the active region 130, which causes no current spreading. Consequently, perfect electrical and optical confinement is realized, achieving a lower threshold current than in the VCSEL 500 in accordance with the second embodiment.

The following is a description of the fabrication process sequence of the VCSEL 800.

The fabrication process sequence is basically the same as that of the VCSEL 100 in accordance with the first embodiment: the difference is the etching depth of the second mesa etching and oxidation method. The etching depth is so controlled that only the lowermost pair in the top mirror 140 is left unetched in the first mesa etching, and the uppermost pair in the bottom mirror 120 is etched in the second mesa etching. The etching depth is controlled by adjusting the etching time. In the present embodiment the selective oxide region 810 consisting of a single layer is formed on each side of the active layer; however, the number of the selective oxide region 810 is not limited to one. For example, it is possible to provide the selective oxide region 810 consisting of a single layer above the active region 130 and the selective oxide regions 810 consisting of two layers below the active region 130.

The selective oxidation for the formation of the active region 810 is conducted by using a mixture solution of $H_2O_2$ and $FeCl_2$ (iron chloride(II)). The mixture solution is prepared by mixing 1000 cc of $H_2O_2$ and 0.025 g of $FeCl_2$ and heating the mixture to about 60° C. A semiconductor laser is immersed in the heated mixture solution, so as to conduct selective oxidation. The depth of oxidation towards the mesa center is controlled by adjusting the oxidation time. Since this method uses $FeCl_2$ which enhances oxidations, effective oxidation can be performed in a shorter time than in the oxidation method used for the VCSEL 500 in accordance with the second embodiment. Instead of $FeCl_2$, $FeCl_3$ (iron chloride (III)) can be used for selective oxidation. This oxidation method can be applied to the selective oxidation of the VCSEL shown in FIGS. 1 and 5. Conversely, the oxidation method in accordance with the first or second embodiments can be applied to the selective oxidation of the VCSEL shown in FIG. 8. The structure of VCSEL does not restrict the oxidation method used for fabricating the VCSEL.

As described hereinbefore, in the VCSEL 800 in accordance with the present embodiment AlAs layers of both the n-type top mirror 140 and the p-type bottom mirror 120 are selectively oxidized, so as to conduct electrical confinement above and below the active region 130. As a result, perfect electrical and optical confinement is realized, achieving a VCSEL with a low threshold current. Furthermore, the addition of $FeCl_2$ or $FeCl_3$ for enhancing oxidation to $H_2O_2$ makes the selective oxidation process more effective and shorter.

(Embodiment 4)

Figure 11:
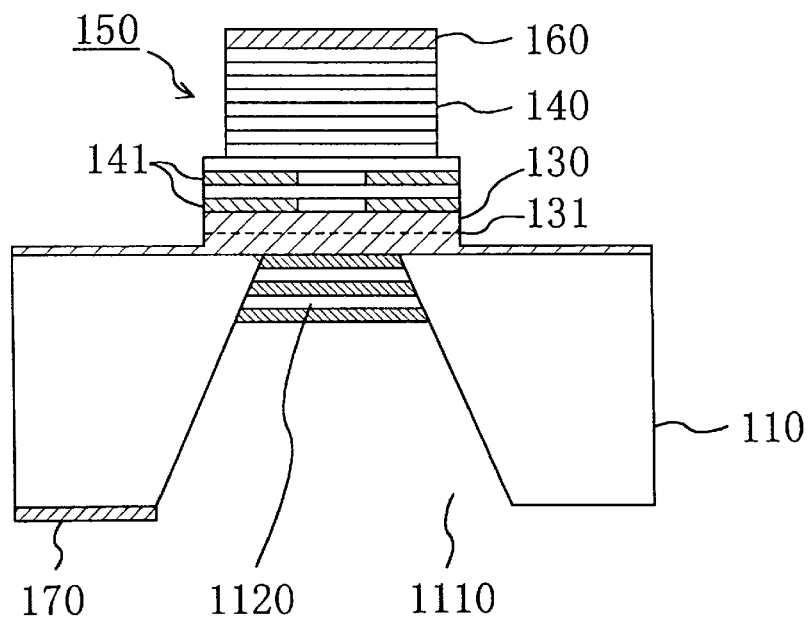
FIG. 11 is a schematic cross section illustrating a VCSEL in accordance with the fourth embodiment of the present invention.

FIG. 11 is a schematic cross section illustrating a VCSEL 1100 in accordance with the fourth embodiment of the present invention. The VCSEL 1100 shown in FIG. 11 is formed on a p-type GaAs substrate 110. The VCSEL 1100 has a multilayer structure for laser oscillation comprising a bottom dielectric mirror 1120, an active region 130, and an n-type top mirror 140. The bottom dielectric mirror 1120 is formed in an opening made by a selective etching from the bottom surface of the substrate 110. The active region 130 is formed on the substrate 110 in such a manner as to be disposed between the bottom dielectric mirror 1120 and the top mirror 140. The multilayer structure is the same as that in the first embodiment except the bottom dielectric mirror 1120. The bottom dielectric mirror 1120 is composed of stacked five pairs of $SiO_2$ layers and $TiO_2$ layers.

The mesa 150 includes two-step mesa sections: the bottom mesa section has a larger outer diameter than the top mesa section. To be more specific, the top mesa section has a diameter of about 8 μm and the bottom mesa section has a diameter of about 9 μm. The mesa 150 having such two-step structure is formed by the fabrication method in accordance with the first embodiment.

The peripheral edge of the p-type AlAs layers included in the top mesa section is hardly oxidized, but the peripheral edge of the p-type AlAs layers included in the bottom mesa section is selectively oxidized. As a result, each p-type AlAs layer included in the bottom mesa section is divided into a selective oxide region 141 and a core semiconductor region which is surrounded by the selective oxide region 141.

In the present embodiment only one of the pair mirrors has a DBR structure which is composed of aluminum-contained first layers and second layers different from the first layers, and only two of the first layers closest to the active region 130 are selectively oxidized. Thus, in the present invention one of the top and bottom mirrors can be made of a different material from the other.

(Embodiment 5)

FIG. 12 is a schematic cross section illustrating a VCSEL array 1200 in accordance with the fifth embodiment of the present invention. The VCSEL array 1200 shown in FIG. 12 has a structure comprising a plurality of light emitting units (vertical cavities) integrated on a single substrate. The same components as those of the VCSEL 100 in accordance with the first embodiment are assigned the same reference numbers and their description is not repeated.

In the present embodiment the bottom mirror 120 is shared by a plurality of vertical cavities, and the driving current flows between the bottom mirror 120 and each of the top mirrors 140. As a result, laser oscillation occurs in each cavity. Since each cavity has the same electrical and optical confinement structure as in the first embodiment, a low threshold current is achieved and a high light output is obtained.

In all the embodiments, the p-type conductivity and the n-type conductivity can be switched without losing the effects of the present invention. Also, it goes without saying that semiconductor materials based on GaAs used in the disclosed embodiments can be replaced by those based on InP, GaN or the like.

As described hereinbefore, a SEL in accordance with the present invention having the above-mentioned structure does not cause an increase in the mirror resistance even if a selective oxide process is used although it has a mirror with a non-hybrid structure, and can achieve a low resistance and low threshold current.

What is claimed is:

1. A surface-emitting laser comprising an active region which includes a light emitting layer and two mirrors which sandwich said active region, wherein
at least one of said two mirrors has a distributed Bragg reflector structure which has a plurality of first layers including aluminum and a plurality of second layers different from said first layers;
at least one selected layer of said plurality of first layers has a selective oxide region including aluminum and a core semiconductor region surrounded by said selective oxide region; and other layers of said plurality of first layers do not have said selective oxide region.

2. The surface-emitting laser of claim 1, wherein said core semiconductor region is made of a semiconductor including aluminum, and said plurality of second layers are each made of a semiconductor which is lattice matched with said semiconductor including aluminum.

3. The surface-emitting laser of claim 2, wherein said at least one selected layer having the selective oxide region is disposed closer to said active region than said other layers of said plurality of first layers which do not have said selective oxide region in said distributed Bragg reflector structure.

4. The surface-emitting laser of claim 3, wherein said distributed Bragg reflector structure includes a mesa at least in part thereof.

5. The surface-emitting laser of claim 4, wherein said mesa of said distributed Bragg reflector structure comprises two mesa sections having different outer diameters, and said selective oxide region is formed in a bottom mesa section of said two mesa sections.

6. The surface-emitting laser of claim 4, wherein said mesa in said distributed Bragg reflector structure includes a tapered portion at least in part thereof, and the tapered portion has an inclined side wall.

7. The surface-emitting laser of claim 6, wherein the inclined side wall of said mesa is at least partly covered with an electrode.

8. The surface-emitting laser of claim 7, wherein of said plurality of first layers, layers whose end surfaces are covered with said electrode do not substantially include said selective oxide region.

9. The surface-emitting laser of claim 1, wherein there is an intermediate layer disposed between each of said plurality of first layers and each of said plurality of second layers.

10. The surface-emitting laser of claim 1, wherein each of said two mirrors has said distributed Bragg reflector structure including said selective oxide region.

11. The surface-emitting laser of claim 1, wherein one of said two mirrors is made of a dielectric multi-layered film.

12. The surface-emitting laser of claim 2, wherein said core semiconductor region is made of AlAs and said plurality of second layers are made of GaAs.

13. A surface-emitting laser comprising an active region which includes a light emitting layer and two mirrors which sandwich said active region, wherein
at least one of said two mirrors has a distributed Bragg reflector structure which has a plurality of first layers including aluminum and a plurality of second layers different from said first layers;
at least one selected layer of said plurality of first layers has a surface passivation region and a core semiconductor region surrounded by said surface passivation region; and
other layers of said plurality of first layers do not have said surface passivation region.

14. The surface-emitting laser of claim 13, wherein said surface passivation region is formed in a selective oxidation process.

15. A surface-emitting laser array comprising a plurality of vertical cavities arranged on a single substrate, said surface-emitting laser array further comprising a single bottom mirror which is shared by said plurality of vertical cavities, a plurality of top mirrors associated with a respective one of said plurality of vertical cavities, and a plurality of active regions disposed between said plurality of top mirrors and said bottom mirror, wherein
at least one of said bottom mirror and said plurality of top mirrors has a distributed Bragg reflector structure which has a plurality of first layers including aluminum and a plurality of second layers different from said first layers;
at least one selected layer of said plurality of first layers has a selective oxide region including aluminum and a core semiconductor region surrounded by said selective oxide region; and
other layers of said plurality of first layers do not have said selective oxide region.

* * * * *